United States Patent
Juergens

(10) Patent No.: US 9,001,310 B2
(45) Date of Patent: Apr. 7, 2015

(54) LITHOGRAPHIC SYSTEMS AND PROCESSES OF MAKING AND USING SAME

(71) Applicant: Carl Zeiss SMT GmbH, Oberkochen (DE)

(72) Inventor: Dirk Juergens, Lauchheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 344 days.

(21) Appl. No.: 13/626,416

(22) Filed: Sep. 25, 2012

(65) Prior Publication Data

US 2013/0094010 A1 Apr. 18, 2013

Related U.S. Application Data

(63) Continuation of application No. PCT/EP2010/055419, filed on Apr. 23, 2010.

(51) Int. Cl.
G03B 27/32 (2006.01)
G03B 27/54 (2006.01)
G03F 7/26 (2006.01)
G03F 7/20 (2006.01)

(52) U.S. Cl.
CPC .............. *G03F 7/26* (2013.01); *G03F 7/70266* (2013.01); *G03F 7/70308* (2013.01); *G03F 7/70341* (2013.01)

(58) Field of Classification Search
CPC .......................... G03F 7/70266; G03F 7/70308
USPC ...................... 355/52, 53, 55, 67, 77; 359/875
See application file for complete search history.

(56) References Cited

U.S. PATENT DOCUMENTS

| | | | |
|---|---|---|---|
| 5,805,273 A | 9/1998 | Unno | |
| 6,104,472 A | 8/2000 | Suzuki | |
| 6,191,898 B1 | 2/2001 | Trunz et al. | |
| 6,665,049 B1 * | 12/2003 | Takahashi | 355/53 |
| 7,061,671 B2 * | 6/2006 | Ozawa | 359/352 |
| 2003/0063268 A1 | 4/2003 | Kneer et al. | |
| 2003/0174297 A1 | 9/2003 | Chiba et al. | |
| 2004/0042094 A1 | 3/2004 | Matsuyama | |
| 2004/0169836 A1 | 9/2004 | Wegmann | |
| 2004/0233409 A1 | 11/2004 | Schuster et al. | |
| 2006/0012767 A1 | 1/2006 | Komatsuda et al. | |

(Continued)

FOREIGN PATENT DOCUMENTS

| | | |
|---|---|---|
| EP | 1 768 172 A1 | 3/2007 |
| JP | H 10-242048 | 9/1998 |

(Continued)

OTHER PUBLICATIONS

Wang et al., "Differential equation design of finite-conjugate reflective systems," Applied Optics 32 (1993), No. 7, pp. 1179-1188.

(Continued)

*Primary Examiner* — Hung Henry Nguyen
(74) *Attorney, Agent, or Firm* — Fish & Richardson P.C.

(57) ABSTRACT

A lithographic system includes a projection system for projecting an object field through a projection system's pupil onto an image field. The projection system includes an optical element located at the projection system's pupil. The projection system's pupil is manipulable with respect to normalized pupil heights by the optical element. Related processes are also disclosed.

18 Claims, 8 Drawing Sheets

(56) References Cited

U.S. PATENT DOCUMENTS

| | | |
|---|---|---|
| 2006/0244940 A1 | 11/2006 | Uehara |
| 2007/0058274 A1* | 3/2007 | Singer et al. .......... 359/857 |
| 2007/0183017 A1 | 8/2007 | Hembd |
| 2008/0174858 A1 | 7/2008 | Feldmann et al. |
| 2008/0316443 A1 | 12/2008 | Shigenobu |
| 2010/0321661 A1 | 12/2010 | Natt et al. |

FOREIGN PATENT DOCUMENTS

| | | |
|---|---|---|
| JP | 2002-258131 | 9/2002 |
| JP | 2003-535356 | 11/2003 |
| JP | 2007-506990 | 3/2007 |
| JP | 2009-4509 | 1/2009 |
| KR | 10-0918335 | 4/2007 |
| KR | 10-0854052 | 8/2008 |
| KR | 10-0945605 | 12/2008 |
| WO | WO 2006/001291 | 1/2006 |
| WO | WO 2008/034636 | 3/2008 |
| WO | WO 2008/037496 | 4/2008 |
| WO | WO 2009/106217 | 9/2009 |

OTHER PUBLICATIONS

The International Search Report and Written Opinion from the counterpart PCT Application No. PCT/EP2010/055419, dated Feb. 1, 2011.

Korean Office Action, with translation thereof, for KR Appl No. 10-2012-7030362, dated May 27, 2014.

Japanese Office Action, with translation thereof, for JP Appl No. 2013-505341, dated Nov. 27, 2013.

* cited by examiner

LITHOGRAPHIC SYSTEMS AND PROCESSES OF MAKING AND USING SAME

CROSS-REFERENCE TO RELATED APPLICATIONS

This application is a continuation of, and claims benefit under 35 USC 120 to, international application PCT/EP2010/055419, filed Apr. 23, 2010. International application PCT/EP2010/055419 is hereby incorporated by reference in its entirety.

FIELD

The disclosure relates to a lithographic system, a process of operating a lithographic system and a process of manufacturing a lithographic system.

BACKGROUND

Projection exposure systems for microlithography, for short "lithographic systems" include highly sophisticated optical projection systems, for short "projection systems". Such projection systems include a great number of individual optical elements such as lenses or mirrors, such as disclosed in, for example, US20080174858A1. The use of a great number of optical elements is mainly driven by the desire to provide high resolution imaging over a large object field.

SUMMARY

In some instances, it is desirable to project structures at a resolution of, for example, 45 nm structure size from a reticle onto a wafer. The resolution limit R is given by $$R = k_1 \frac{\lambda}{NA} \quad (1)$$

where $\lambda$ is the wavelength of projection light, $NA = n_{image} \sin(i_{image,max})$ is the numerical aperture at the image side which is the product of the index of refraction of the medium at the image side of the projection system $n_{image}$ and the sine of the maximum aperture angle at the image side $i_{image,max}$. The constant $k_1$ is a process factor which includes miscellaneous factors which influence the resolution limit R, such as, for example, properties of the resist at the wafer.

It is also generally desirable to provide high throughput. This means that it is often desirable for the projection to be performed all over an object field which is desirably as large as possible.

As a result, it is commonly desirable to image an object field, e.g., 57.5 mm with an image side numerical aperture, e.g., minimum of 0.9 in the case of a dry projection system and image aberrations of, e.g., less than a few percent $\lambda$ wavefront rms. Here $\lambda$ is the wavelength of the projection light, such as, for expel, approximately 248 nm, 193.3 nm or 13.5 nm.

A "dry projection system" is understood herein to be a projection system which has a gaseous medium as the very last medium before the image plane of the projection system, where the wafer is located. An "immersion projection system" is understood to mean a projection system having a liquid as the very last medium before its image plane. An immersion projection system can have an image side numerical aperture which is approximately 1.5 times larger than the image side numerical aperture for a corresponding dry projection system because the very last medium in an immersion projection system has an index of refraction of approximately 1.5 instead of approximately 1.0.

Often, to provide a projection system, there are three main issues to handle:
1. Find an optical design for the projection system with desired large image field, desired large numerical aperture at the image side and desired low image aberrations.
2. Build up this optical design into a real world projection system within error budgets for its optical components that provide that the desired low image aberrations hold for the real world projection system, too.
3. Provide a mechanism to customize this real world projection system to the desired properties of a client and to provide this performance during operation of the projection system for its entire lifetime.

The definitions of the following aberrations and other technical terms in optical design are taken from the Handbook of Optical Projection systems, Vol. 1, Wiley-VHC, Berlin 2005.

To address item 1, the designer may start with the definition of appropriate target values for the size of the object field and the image side numerical aperture. Thereafter the designer can arrange an initial design of the projection system as a starting point for subsequent improvements to reduce the overall image aberrations of the projection system.

It is commonly desirable to reduce these aberrations of the optical design in the so-called "aplanatic correction" which provides that the angular dependency of the intensity of projection light within the entrance pupil of an arbitrary point in the object field is proportional to the angular dependency in its exit pupil. In other words, the magnification of the projection system is invariant with respect to object high and pupil high, or, more geometrically speaking, the projection system has desirably fulfills the so-called "sine condition" over the entire object field as well as possible.

However the sine condition is a demand that relates entrance pupils with exit pupils. There is generally no demand to fulfill the sine condition with respect to other pupils of the projection system.

In what follows, any pupil P of the projection system different from the entrance pupil and the exit pupil will be called a "projection system pupil". The fact that the sine condition may be contravened with respect to a fixed projection system's pupil P relative to the entrance pupil is the "offence against the sine condition with respect to P" in what follows. Note that in this definition the exit pupil may replace the entrance pupil since in general there is no offence against the sine condition with respect to the exit pupil in the relevant projection systems under consideration.

This offence against the sine condition with respect to a projection system pupil P effects a non-constant distortion of the projection system pupil P. More mathematically speaking pupil highs within the entrance pupil and pupil highs within the exit pupil are mapped one-to-one by a linear function but in general there is only a monotonous (but in general nonlinear) functional relationship $$r = \phi_P(\rho) \quad (2)$$

mapping pupil highs $\rho$ of the entrance pupil onto pupil highs r of the projection system pupil P. Hence the offence against the sine condition with respect to the projection system pupil P can be quantified by the non-linear function $\phi_P$. Since for any projection system pupil P its pupil heights can be mapped one-to-one by a linear function onto the interval [0,1] in what follows $\phi_P$ can be assumed to be a function mapping [0,1] onto itself, i. e. $\phi_P: [0,1] \to [0,1]$ and pupil heights are always normalized in what follows, i. e. parameterized by the interval [0,1], and for short: $\phi_P$ is the to be the offence against the sine condition with respect to the projection system pupil P.

To address the item 2 above, a potentially important way to build up a projection system within its error budget is the local correction of the surface-shapes of its optical elements. The so-called "ion beam figuring" is an abrasive profile shaping technique suitable to provide surface deformations to optical elements within a nanometer range, such as disclosed, for example, in US20030174297A1 and US20040042094A1. An important location within the projection system to provide such a local correction to an optical element of the projection system is at a projection system pupil since each correction mean provided at a projection system pupil results in a correction of the exit pupil which is independent of the image height. Therefore in what follows the term "exit pupil" without reference to a fixed image point can be used if a correction is made at a projection system pupil.

As referred to herein, an optical element of the projection system is "located at a projection system pupil P" or, for short "at a projection system pupil P" provided there is no second optical element of the projection system different from the optical element which is closer to the projection system pupil P. Furthermore a surface of an optical element is "at a projection system pupil P" provided the optical element is at the projection system pupil P and the surface is closer to the projection system pupil P than any other surface of the optical element. This definition extends naturally to multiple optical elements: a set of optical elements of the projection system is the to be "located at a projection system pupil P" provided the elements are closer to the projection system pupil P than any other optical element of the projection system.

In a nutshell, an appropriate location to relax the error budget by a correction mechanism is a projection system pupil. However in view of the above non-linear function $\phi_P$ of (2) such a correction mechanism does not correct the exit pupil in an undisturbed manner, e. g., a deformation of a surface of an optical element which is located at a projection system pupil and follows a shape of, for example, an astigmatism $r^2 \cos(2\phi)$, $0 \le r \le 1, 0 \le \phi < 2\pi$ (see, for example, Handbook of Optical Projection systems, Vol. 1, Wiley-VHC, Berlin 2005, section 11.5.4) turns out a deformation of the exit pupil which consists of the astigmatism $r^2 \cos(2\phi)$ accompanied by higher astigmatic terms, e. g. $(4r^4-3r^2)\cos 2\phi$.

To address the above item 3, an important approach to customizing the projection system during its operation is to shut down its aperture stop, i. e., to decrease the diameter of the projection systems diaphragm. This affects an increasing depth of focus accompanied by reduced aberrations. The drawback to be paid is a reduced resolution (see, for example, (1)). However, in view of the above non-linear function $\phi_P$ of (2) there is a non-linear relationship between the diameter of the aperture stop and the image side aperture. For example, 10% shutting down does not result in a 10% smaller aperture in general.

Moreover any correction mechanism/manipulation of the projection system which is located at a projection system pupil suffers from this non-linear function $\phi_P$. Such mechanisms are manipulators which drive an optical element, such as disclosed in, for example, US20030063268A1, U.S. Pat. No. 6,191,898B1, U.S. Pat. No. 6,104,472, or which modify the shape of the index of refraction of an optical element, such as disclosed, for example, in WO2008034636A2, U.S. Pat. No. 5,805,273, US20060244940A1.

To summarize: the desire to minimize the offence against the sine condition with respect to entrance and exit pupils generally results in a serious offence against the sine condition $\phi_P$ with respect to the other projection system pupils P. Hence, to improve mechanisms of the projection system which are located at a projection system pupil P it is desirable to customize those mechanisms with respect the offence against the sine condition $\phi_P$ at the projection system pupil P.

In general such a mechanisms are optical elements which manipulate the wavefront within the projection system pupil P, for short "which manipulate the system pupil P". Since the offence against the sine condition affects only the radial component within a pupil only such optical elements are of interest whose manipulation varies with respect to a radial component, for short "the optical element manipulates the projection system pupil P with respect to its pupil heights". For example, a stop or a deformation of a surface of the optical element located at a projection system pupil P manipulates the projection system pupil P with respect to its pupil heights and a polarizing optical element which changes the polarization state of the entire wavefront independent of the pupil height within the projection system pupil P will not take advantage from the invention. Without loss of generality the pupil heights can be normalized to be parametrized by the unit interval [0,1].

In one aspect, the disclosure provides a process of operating a lithographic system wherein the lithographic system includes a projection system for projecting an object field through a projection system pupil P onto an image field, the projection system includes an optical element located at the projection system pupil P, the projection system pupil P being manipulable by the optical element with respect to normalized pupil heights r.

The process includes projecting the object field through the projection system pupil P onto the image field and manipulating the projection system pupil P by the optical element at normalized pupil heights $r=f_P(\rho)$ in order to manipulate the exit pupil at normalized pupil heights $\rho$. At this, $f_P: [0,1] \rightarrow [0,1]$ is non-linear function approximating the offence against the sine condition $\phi_P$ with respect to the projection system pupil P.

At this, "approximation" has to be understood to be a best approximation within some fixed set of functions, e.g., polynomials, and with respect to some fixed norm, e.g., root-mean-square rms.

Such a process of operating a lithographic system does not ignore the offence against the sine condition $\phi_P$ with respect to the projection system pupil P. Since $f_P$ approximates $\phi_P$ the process allows a manipulation of the exit pupil approximately at their undisturbed pupil heights.

For example, U.S. Pat. No. 6,104,472 discloses at column 5, row 9 manipulating a projection system pupil P via a pair of plane glass plates, sometimes called Alvarez Plates. The first embodiment in U.S. Pat. No. 6,104,472 tries to correct axial astigmatism at this projection system pupil P without adversely affecting other optical characteristics (see, for example, col. 5, lines 54 et seq.). However, the aspherization of these plates in the form of polynomials up to the $3^{rd}$ order (see, for example, the first embodiment of U.S. Pat. No. 6,104,472) effects a correction of the axial astigmatism at the place of this fixed projection system pupil P. In general, the pupil distortion between this fixed projection system pupil P and the exit pupil of an image point will adversely effect astigmatic terms of higher order.

In some embodiments, the non-linear function $r=f_P(\rho)$ is a polynomial $f_P(\rho)=\Sigma_{i=1}^m b_i \rho^i$, where $m \le 5$ or preferably $m=2$.

Such a process of operating a lithographic system can provide an easy to calculate non-linear function $f_P$ since a polynomial is an easy to calculate function. A polynomial of $2^{nd}$ degree is the minimum requirement to follow the nonlinearity of $\phi_P$. Polynomials of higher orders up to the $5^{th}$ degree provide an even more general set of functions to approximate within and the approximation turns out to be more accurate than that by a polynomial of $2^{nd}$ order.

In certain embodiments, the manipulable optical element is a projection system aperture stop, and the projection system pupil is manipulated by stopping down the stop proportional to $r=f_P(\rho)$ in order to stop down the exit pupil proportional to $\rho$.

Such a process of operating a lithographic system can have the advantage that stopping down proportional to $r=f_P(\rho)$ turns out a controlled, proportional decreasing of the aperture.

In some embodiments, the projection system pupil P is manipulated by the optical element in order to manipulate the wavefront $\Sigma_i \alpha_i Z_i(\rho,\phi)$ in the exit pupil and this manipulation influences significantly a finite subset of Zernike coefficients $\{\alpha_i; i=i_1, \ldots, i_k\}$.

A definition of the term "significantly" is given accompanying the description of the figures.

At this the wavefront in the exit pupil is expanded into an orthogonal expansion $\Sigma_i \alpha_i Z_i(\rho,\phi)$ of Zernike polynomial $Z_i(\rho,\phi)$ with coefficients $\alpha_i$ (see, for example, Handbook of Optical Projection systems, Vol. 1, Wiley-VHC, Berlin 2005, section 11.5.4).

Such a process of operating a lithographic system like statement can have the advantage of decoupling the Zernike coefficients $\alpha_i$ within the exit pupil into a set of affected Zernike coefficients and a set of unaffected Zernike coefficients. This is advantageous since a crosstalk of any finite set of Zernike coefficients $\alpha_i$, $i=i_1, \ldots, i_k$ to additional terms provides a correction mean for this finite set together with the side action of disturbing additional Zernike coefficients.

In one aspect, the disclosure provides a process of manufacturing a lithographic system wherein the lithographic system includes a projection system for projecting an object field through a projection system pupil P onto an image field, the projection system includes an optical element having a surface located at the projection system pupil P, the process including of providing the surface with a surface deformation $\Sigma_i^n \alpha_i Z_i(r, \phi)$ in order to correct the wavefront in the exit pupil by $\Sigma_i^n \alpha_i Z_i(\rho,\phi)$, wherein $r=f(\rho)$ and $f_P::[0,1]\rightarrow[0,1]$ is a non-linear function approximating the offence against the sine condition $\phi_P$ between the normalized exit pupil and the normalized projection system pupil P.

A definition of a surface deformation like $\Sigma_i^n \alpha_i Z_i(r,\phi)$ is given accompanying the description of the figures.

Such a process of manufacturing a lithographic system can provide that any finite set of Zernike coefficients in the wavefront of the exit pupil can be corrected without side effect to additional coefficients. This is advantageous since the error budget of the wavefront is generally mainly driven by some single lower Zernike coefficients. Other—especially higher—coefficients in general are summed up in form of an rms and such an rms is related to a single budget. Ignoring the offence against the sine condition with respect to the projection system pupil P turns out a crosstalk from each error budget of a single Zernike coefficient to the above error budget of the rms. Since this holds for any single Zernike coefficient all these crosstalks end up in a common single error budget which may run out of control.

In some embodiments, the surface deformation is provided by ion beam figuring.

Such a process of manufacturing a lithographic system makes use of the so-called ion beam figuring at a surface located at the projection system pupil P. This is a well-known technique which is disclosed, for example, in US2004/0169836A1. However in US2004/0169836A1 the surface deformation is calculated by measurement and ray tracing (see, for example, paragraphs [0022] and [0023] of US2004/0169836A1) and is determined for each single projection system to be manufactured. The approximation $f_P$ of the offence against the sine condition $\phi_P$ is determined only once and is understood to be an a priori assembling correction mean. However, US2004/0169836A1 may put the manufacturer in position to correct errors which are present after assembly, whereas the processes disclosed herein may put the manufacturer of the projection system in position to relax the error budget for the assembly by shifting a part of it from post-assembly to pre-assembly.

In certain embodiments, the image side aperture of the projection system is not less than 0.9, preferably not less than 0.95, in case of a dry projection system, or the image side numerical aperture of the projection system is not less than 1.35, preferably not less than 1.425, in the case of an immersion projection system and/or the diameter of the image field is not less than 56 mm.

In some embodiments, the projection system is a catadioptric projection system and/or the projection system is an immersion projection system.

In certain embodiments, the projection system includes two biconvex lenses located at the projection system pupil P.

In some embodiments, the projection system has an optical axis, and the projection is achieved via rays of projection light where the outermost rays of the projection light at the projection system pupil P are parallel to the optical axis.

A process as disclosed herein can localize a projection system whose system pupils contravene the sine condition.

In certain embodiments, the optical element is a lens or a mirror.

The disclosure can be used to identify those projection systems where ignoring the offence against the sine condition $\phi_P$ with respect to the projection system pupil P effects a serious drawback of the effectiveness of any correction element, e. g., a manipulable optical element located at the projection system pupil P.

In some embodiments, manipulation is a deformation of the optical element, or a loading with heat and/or cold, or a shift or rotation of an optical element.

In certain embodiments, manipulable optical elements take the benefit of less crosstalk if they are located at the projection system pupil P and are driven with regard to the offence against the sine condition $\phi_P$ with respect to the projection system pupil P.

Manipulation can be achieved in different ways. US20030063268A1 discloses driving an optical element in the direction of the optical axis of the projection system. U.S. Pat. No. 6,191,898B1 discloses driving an optical element in a direction orthogonal to the optical axis. U.S. Pat. No. 6,104,472 discloses driving Alvarez-Plates or modifying the shape or the index of refraction of an optical element. WO2008034636A2 discloses providing an optical element with a grid of electrical resisting wires which can be charged with electrical current to modify the refractive index of a lens. WO2008037496A2 discloses deforming a lens. US20060244940A1 discloses charging a lens with infrared radiation to modify the refractive index of the lens together with its shape.

BRIEF DESCRIPTION OF THE DRAWINGS

The disclosure will be illustrated with respect to exemplary embodiments and accompanying figures, in which.

DETAILED DESCRIPTION

Figure 1:
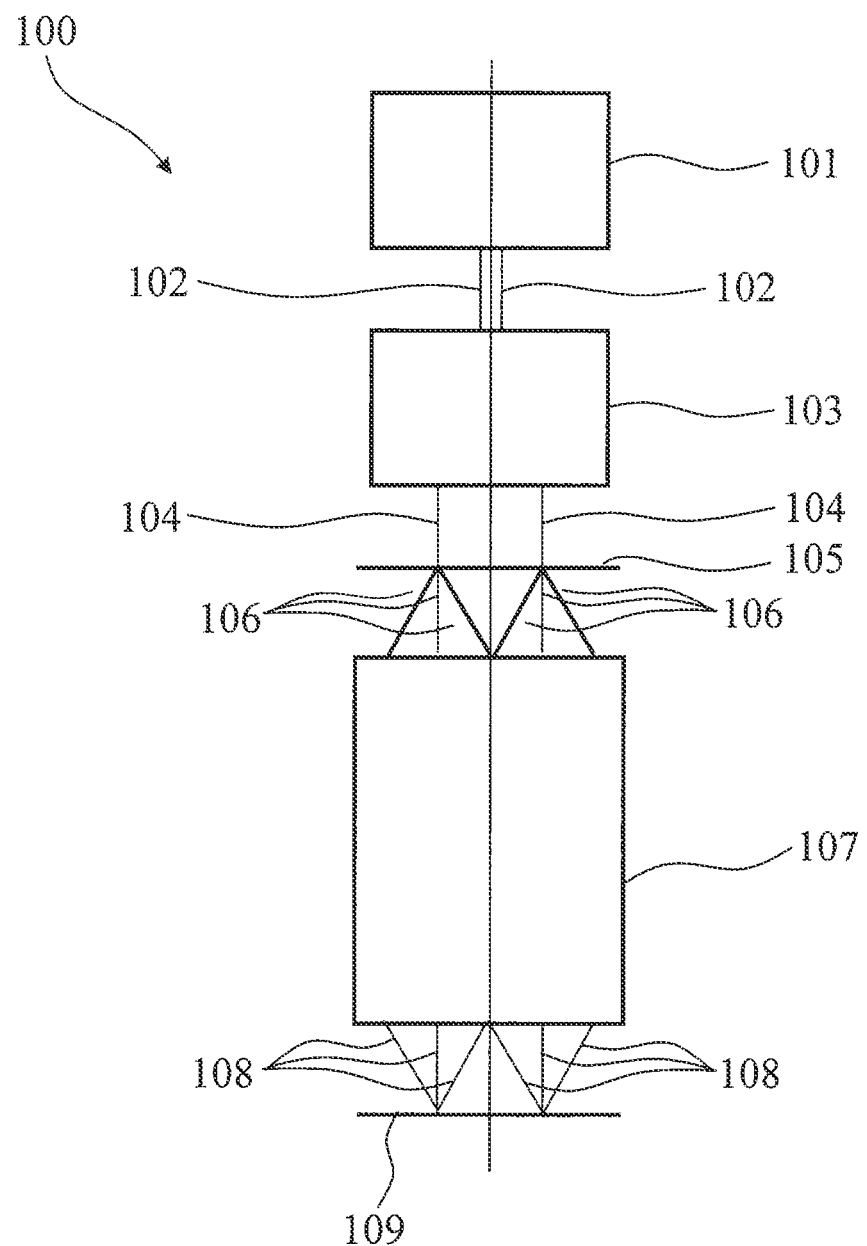
FIG. 1 shows a lithographic system.

FIG. 1 shows a lithographic system 100. The lithographic system 100 includes a light source 101 which produces illumination light 102. The illumination light 102 is prepared by an illumination system 103 to provide prepared illumination light 104. An important difference between illumination light 102 and prepared illumination light 104 is that prepared illumination light 104 exhibits etendue. Illumination system 103 illuminates a reticle (not shown) located at an object field 105 with prepared illumination light 104. Structures (not shown) located on the reticle diffract the prepared illumination light 104 into diffracted light 106 which enters the projection system 107. Diffracted light 106 is projected by the projection system 107 into projected light 108 which exposes the wafer (not shown) which is located at an image field 109.

Figure 2:
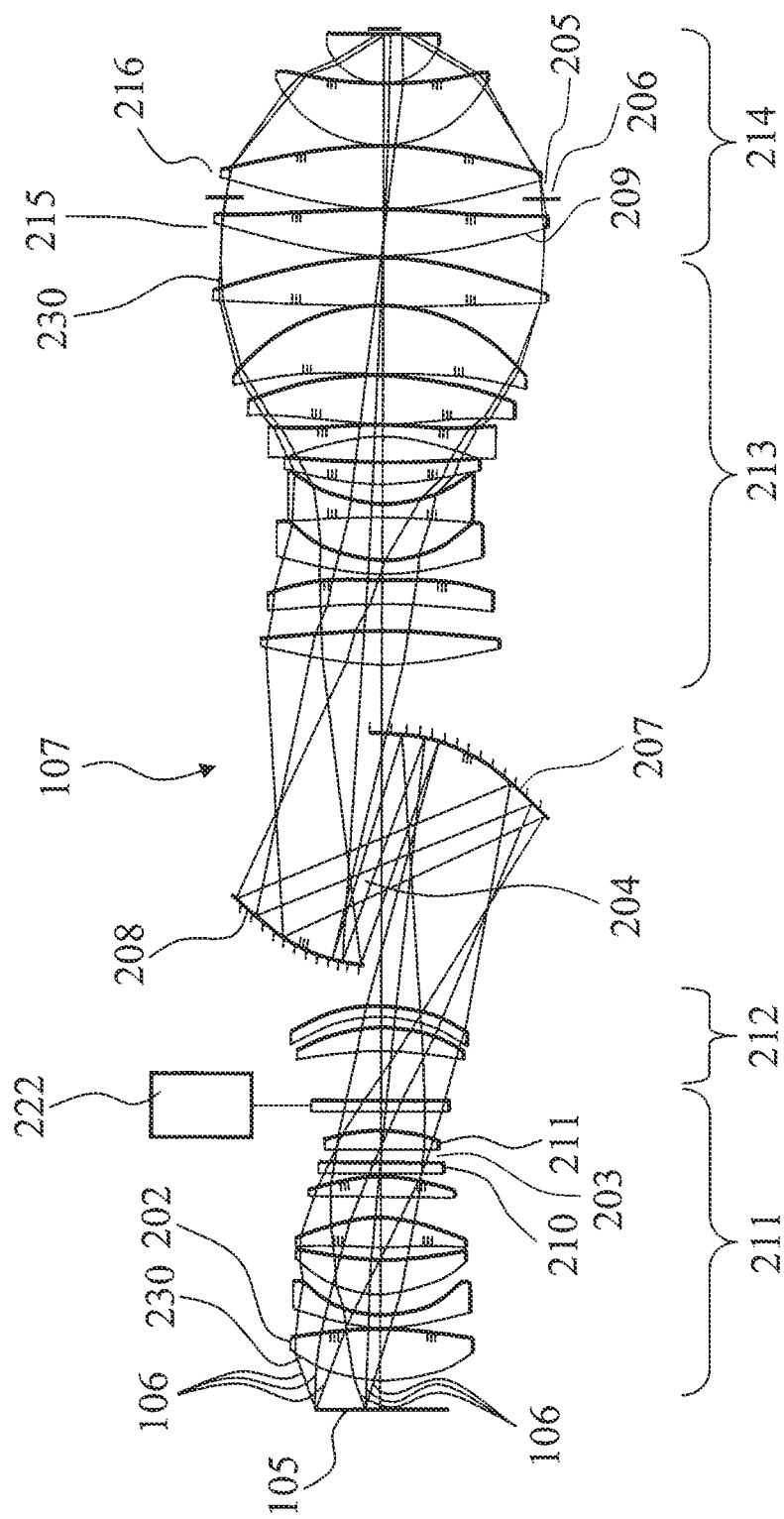
FIG. 2 shows a projection system of a lithographic system.

FIG. 2 shows projection system 107. Diffracted light 106 enters projection system 107 at object field 105 and arrives at the first surface of an optical element 202 of projection system 107 and subsequently passes in succession a first pupil 203 of projection system 107, a second pupil 204 of projection system 107, and a third 205 pupil of projection system 107. The maximum pupil height of the entrance pupil (not shown) corresponds to the maximum angle of a ray of diffracted light 106 which passes the entire projection system 107. Rays having greater angles are stopped via a stop 206 which is located in between lenses 215 and 216. As used herein, the definition of the pupils is understood to be different to the Handbook of Optical Projection systems, Vol. 1, Wiley-VHC, Berlin 2005. The entrance pupil is the image of stop 206 into the object space, i.e. the image of the projection systems stop generated by all optical elements of the projection system located before the projection systems stop. Note that in FIG. 2 the rays are running from the left hand side to the right hand side. The exit pupil is the image of stop 206 into the image space, i.e. the image of the projection systems stop generated by all optical elements of the projection system located after stop 206. More generally, a pupil of projection system 107 is defined to be the image of stop 206 generated by a consecutive sequence of optical elements of projection system 107. Of potentially most interest are those pupils which are real images of stop 206. Those are the entrance pupil, the exit pupil and the projection system pupils. The projection system pupils are located at positions 203, 204 and 205. Projection system pupil 205 is stop 206 itself and can be understood to be the image of stop 206 by an empty set of optical elements. Projection system pupil 204 is located between mirrors 207 and 208 and is the image of 206 generated by the optical elements of the group 213 together with mirror 208. Projection system pupil 205 is located in between lenses 210 and 211 and is the image of 206 generated by the optical elements of groups 213 and 212 together with mirrors 207 and 208. The entrance pupil is located at infinity at the left hand side of the object plane 105 and is the image of stop 206 generated by the optical elements of groups 213, 212 and 211, together with mirrors 207 and 208. Finally, the exit pupil is located at infinity at the right hand side of the image plane and is the image of 206 generated by the optical elements of group 214.

Figure 3:
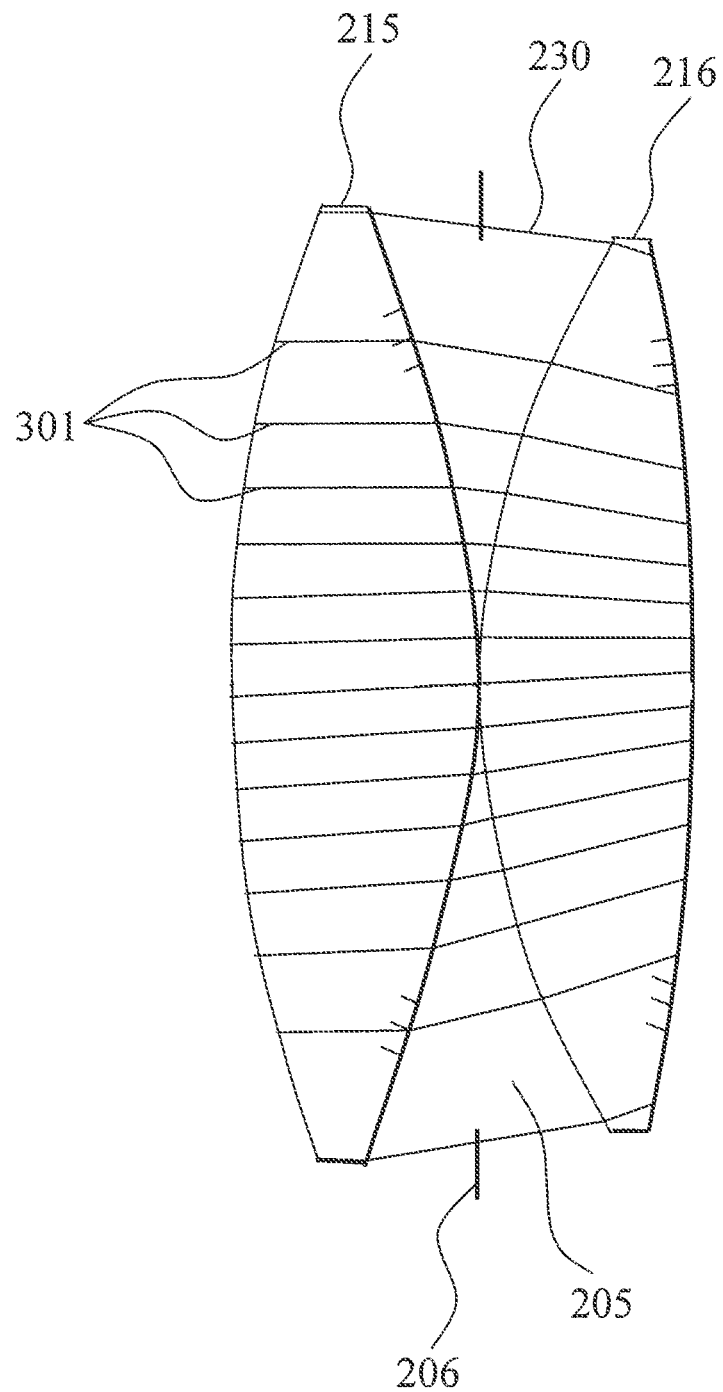
FIG. 3 shows two lenses of the projection system of FIG. 2.

FIG. 3 shows lenses 215 and 216 located before and after stop 206. The numerical aperture of the projection system at its image is 1.35, and its maximum object height is 3.5 mm Projection system 107 is an immersion projection system having an index of refraction of 1.436 of the optical medium just in front of the image field. Furthermore the magnification of projection system 107 is equal to −0.25 which turns out that the largest angle of a ray 230 of diffracted light 106 which passes the projection system at the largest pupil height of the entrance pupil of the projection system 107 is approximately 10.5°. That ray is the outermost ray 230 at the projection systems stop 205. There are other rays 301 shown passing the lenses 215 and 216. These rays do not exhibit equidistant heights despite the fact that they have equidistant pupil heights within the entrance pupil of the projection system 107. This illustrates the offence against the sine condition with respect to pupil 205.

Figure 4:
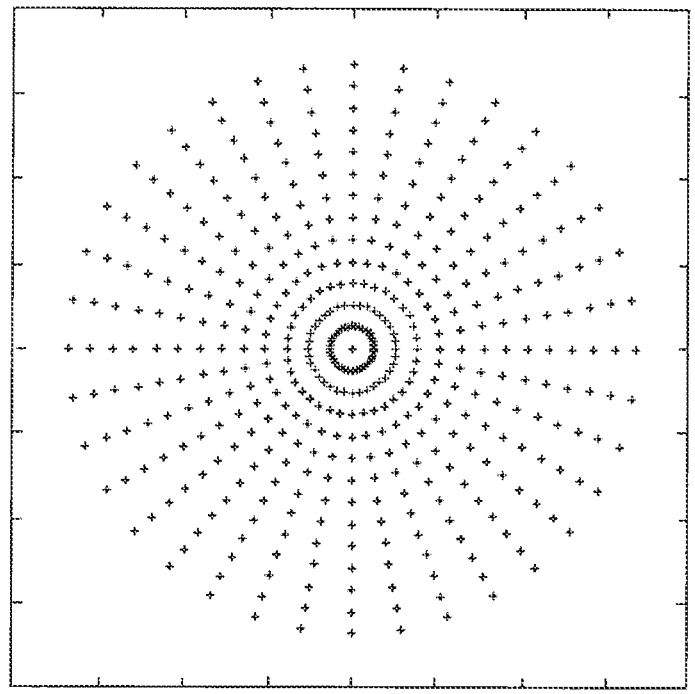
FIG. 4 is a spot diagram of the entrance pupil of the projection system of FIG. 1.
Figure 5:
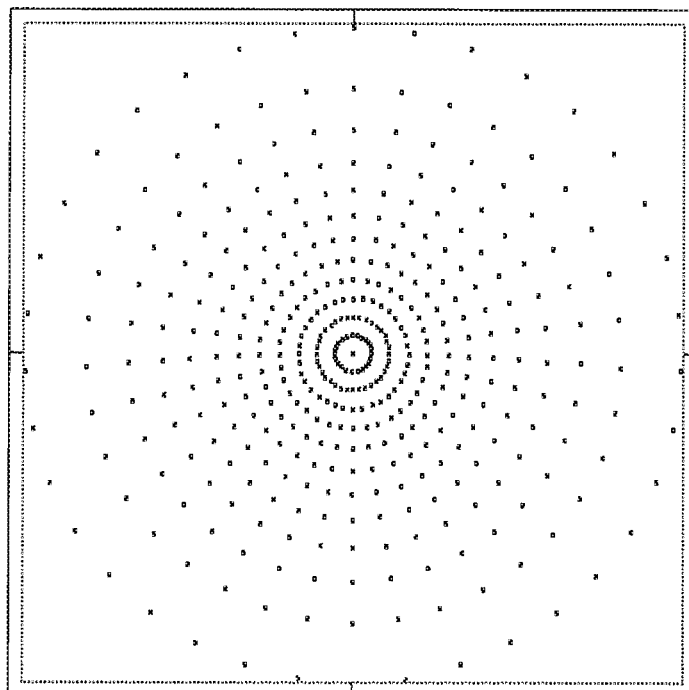
FIG. 5 is a spot diagram of a pupil of the projection system of FIG. 1.

FIGS. 4 and 5 show penetration points of rays within pupils. FIG. 4 shows the entrance pupil. The points are equidistant with respect to the radial coordinate. FIG. 5 shows pupil 205. The points are not equidistant with respect to the radial coordinate. This illustrates the offence against the sine condition with respect to pupil 205.

Figure 6:
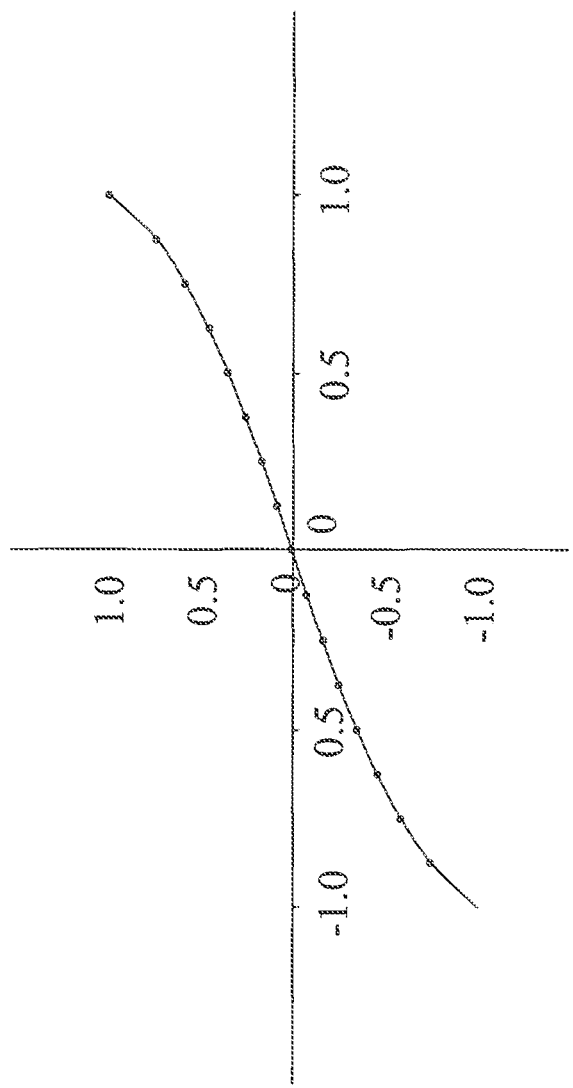
FIG. 6 shows normalized pupil heights.

The graph of FIG. 6 quantifies the offence of the sine condition with respect to pupil 205. The abscissa parameterizes equidistant pupil heights within the entrance pupil. The ordinate parameterizes equidistant pupil heights within pupil 205. Both pupils are normalized, i. e. their maximum pupil heights are equal to one. The dotted graph is the offence against the sine condition $\phi_P: [0,1] \to [0,1]$ mapping pupil heights of equidistant rays within the entrance pupil to pupil heights of the same rays in pupil 205. The dotted graph can be interpolated by a continuous smooth function, e.g. a spline of grade 2, c.f. the continuous graph in FIG. 6. It can also be approximated by a polynomial of e. g. $5^{th}$ order, i.e. $\pi_P(\rho) = 0.3252 \rho^5 - 0.0135 \rho^3 + 0.6851\rho$, $\rho \in [0,1]$ (not shown). Apparently interpolation, approximation as well as the offence against the sine condition $\phi_P:[0,1] \to [0,1]$ itself are nonlinear functions.

Figure 7:
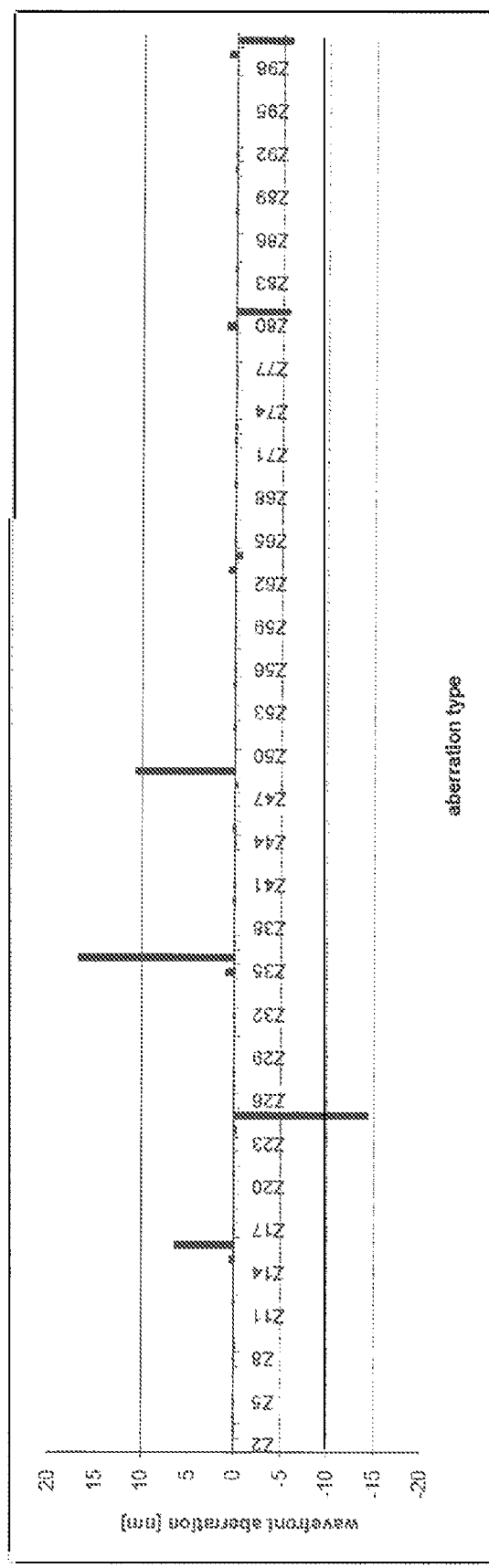
FIG. 7 shows the crosstalk of a surface deformation on a surface of a lens of the projection system of FIG. 1.

FIG. 7 illustrates the crosstalk to additional orders of Zernike coefficients in case of the invention is not used. A surface 209 of optical element 219 which is located at pupil 205 is provided with a surface deformation of 10 nanometers of the Zernike polynomial $Z_{49}(\pi,\phi)$. More precisely on the unit circle, $Z_{49}(\rho,\phi)$ is given by $$Z_{49}(\rho,\phi) = 924\rho^{12} - 2772\rho^{10} + 3150\rho^8 - 1680\rho^6 + 420\rho^4 - 42\rho^2 + 1.$$

On the unit circle, $Z_{49}(\rho,\phi)$ has a maximum value of 1. Its radial variable $\rho$ has to be put in proportionality to the real diameter of a surface 209 of lens 219 and the maximum value of 1 has to be put in proportionality to the real maximum surface deformation of 10 nanometers. If such a surface deformation is provided by a local abrasive technique like ion beam figuring, the real maximum surface deformation is doubled because only glass material is removed.

In FIG. 7 the coefficient spectrum of the wavefront expansion within the exit pupil of the projection system is shown up to an order of 100 coefficients. This spectrum is understood to be the optical effect of the pure deformation of the lens surface 209 as a manipulation mean, i.e. the difference of the spectrum of the wavefront within the exit pupil of the projection system with deformed lens surface 209 and the spectrum of the wavefront within the exit pupil of the projection system without deformation. One can identify a strong peak of about 2.3 nanometer at the $49^{th}$ coefficient which shows that the surface deformation of the lens surface 209 at pupil 205 effects a $49^{th}$ Zernike polynomial in the exit pupil, too. However on the one hand the absolute value of the $49^{th}$ coefficient is not as high as expected in case of a pure $Z_{49}$-deformation of the wavefront, i.e. one would expect approximately 5.0 Nanometer instead of approximately 2.3 Nanometer. On the other hand there is a crosstalk to higher orders $Z_{64}$, $Z_{81}$, $Z_{100}$ as well as to lower orders $Z_{36}$, $Z_{25}$, $Z_{16}$, $Z_9$ and $Z_4$. E.g. the coefficient of $Z_{36}$ is even higher than that of $Z_{49}$ itself. Such strong crosstalk is caused by the offence against the sine condition $\phi_P$ at pupil 205 which is equal to $\phi_P$ of FIG. 6. Therefore one observes the coefficient spectrum of $Z_{49} \circ \phi_P$ within the exit pupil. At this $\circ$ is to be understood to be the composition of functions.

Figure 8:
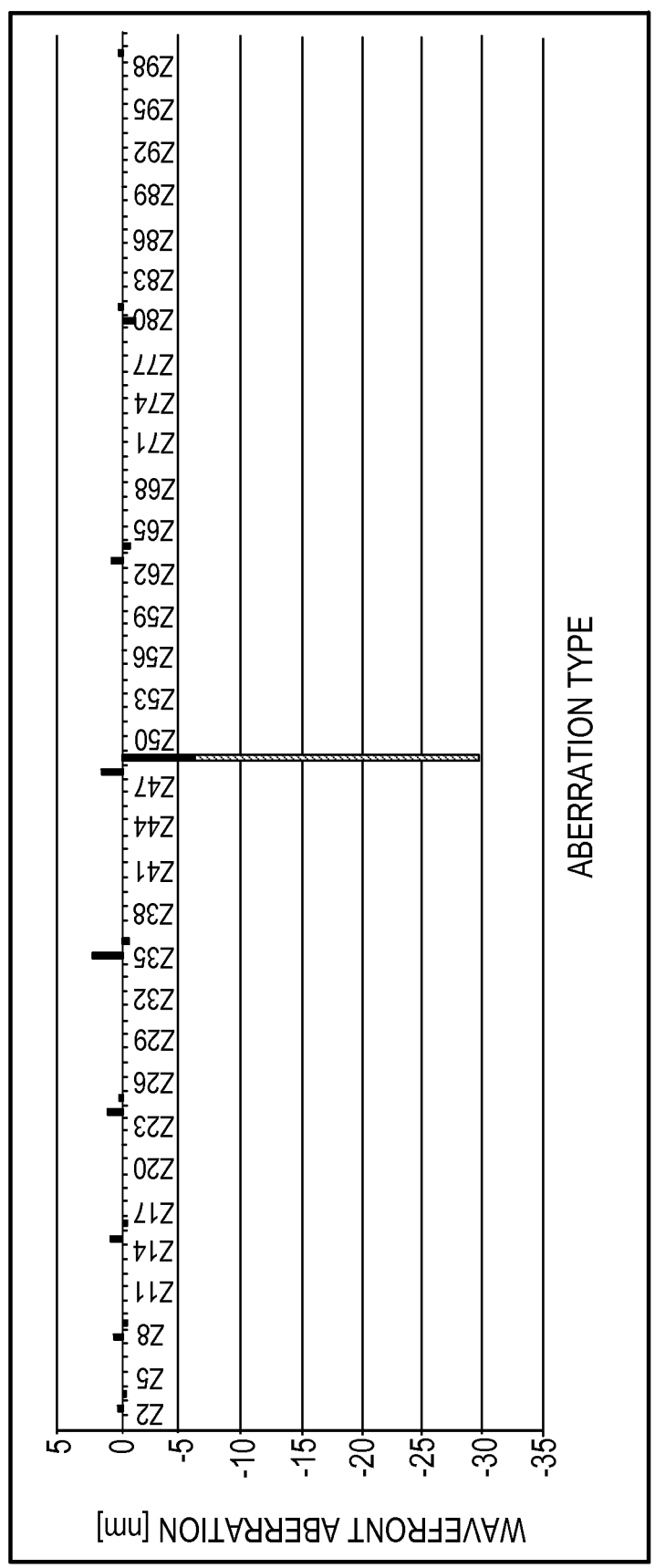
FIG. 8 shows the crosstalk of a surface deformation on a surface of a lens of the projection system of FIG. 1.

In FIG. 8 the same coefficient spectrum is shown for the surface deformation of $Z_{49} \circ \pi_P^{-1}$ instead of $Z_{49}$ where $\pi_P^{-1}$ is understood to be the inverse of $\pi_P$ where $\pi_P$ is the polynomial approximation up to the $5^{th}$ order of the offence against the sine condition $\phi_P$ at pupil 205. One can observe a lower crosstalk to additional Zernike coefficients since in this case $Z_{49} \approx Z_{49} \circ \pi_P^{-1} \circ \phi_P$ instead of $Z_{49} \circ \phi_P$ can be observed within the exit pupil.

In general the same holds true for arbitrary Zernike polynomials other than $Z_{49}$. Since $\pi_P$ effects only the radial variable within the unit circle one can observe that the crosstalk generally effects only coefficients having the same azimuthal order. I.e. a deformation with the shape of a Zernike polynomial having an azimuthal order m effects only coefficients having the azimuthal order m, too. More illustrative the crosstalk remains within a single line of the table of FIG. 11-19 of Handbook of Optical Projection systems, Vol. 1, Wiley-VHC, Berlin 2005.

To be more general a manipulation of an optical element is the to be "influencing" a set of Zernike coefficients $\{\alpha_i; i \in I\}$ if and only if $$0 \neq \alpha_i = \alpha_{i1} - \alpha_{i2}, i \in I \quad (3)$$

where $\Sigma_i \alpha_{i1} Z_i(\rho, \phi)$ is the wavefront expansion in the exit pupil where the optical element is manipulated and $\Sigma_i \alpha_{i2} Z_i (\rho, \phi)$ is the wavefront expansion in the exit pupil where the optical element is not manipulated. E.g. FIG. 7 shows that the $Z_{49}$-deformation of the surface 209 of optical element 219 influences the set of Zernike coefficients where I consists of all square integers which means that precisely all rotational symmetric Zernike polynomials are affected by the manipulation (see, for example, Handbook of Optical Projection systems, Vol. 1, Wiley-VHC, Berlin 2005).

The 0 in formula (3) is more or less theoretically. To quantify it a set of Zernike coefficients $\{\alpha_i; i \in I\}$ is the to be "significantly influenced" by a manipulation if and only if $$\frac{\max\{|a_i|; i \notin I\}}{\min\{|a_i|; i \in I\}} < 0.1 \quad (4)$$

where the $\alpha_i$ are given by (1) and there is no subset of I which holds (2), too. In words the set of all Zernike coefficients divides into a smallest subset I and its complement such that any coefficient of the complement is less than 1% in absolute value of any element of I. E.g. if the coefficients are given by $$a_i = \frac{1}{i}$$

there is no significantly influencing set of coefficients. In case of the FIG. 7 and the $Z_{49}$-deformation of surface 209 of the lens 219 there is no significantly influencing set of coefficients, too. More precisely there is no finite significantly influencing set. If the offence against the sine condition with respect to pupil 205 is taken into account, i. e. surface 209 of the lens 219 is deformed according to the shape $Z_{49} \circ \pi_P^{-1}$ one observes the spectrum of FIG. 8 and I={49} is the significantly influenced set.

Since deformations and more general manipulation mechanisms can be superimposed the invention provides a mean to influence significantly finite sets of Zernike coefficients of the wavefront within the exit pupil by taken into account the offence against the sine condition with respect to pupil 205.

Neither the system of Zernike polynomials does limit the invention nor does so the value 0.1 on the right hand side of formula 4. Any system of functions a wavefront can be expanded within will serve well as analogue to describe the benefit of the invention and values other than 0.1 to quantify the crosstalk of the coefficients may be used. To take into account the offence against the sine condition $\phi_P$ with respect to pupil 205 and its countermean, the transformation of the radial variable $\rho$ by $\pi_P^{-1}$ is the root of the matter.

Moreover the deformation of a surface of a lens is just an example to illustrate the invention. The invention provides a countermean against the crosstalk to additional Zernike coefficients as intended to influence for any type of manipulator located at an arbitrary projection system pupil within the projection system.

Figure 9:
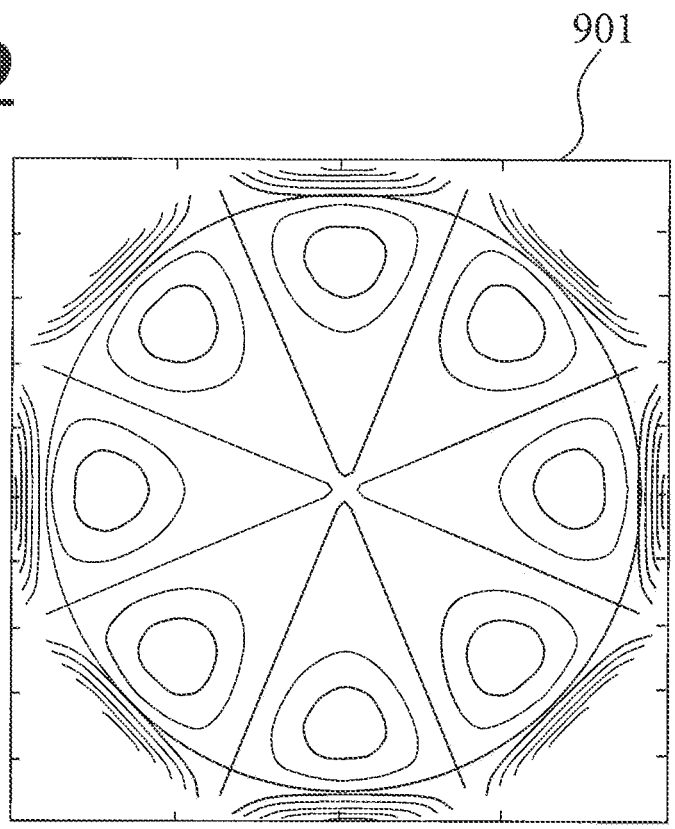
FIG. 9 shows the wavefront in the exit pupil of an off-axis field point of the projection system of FIG. 1.
Figure 10:
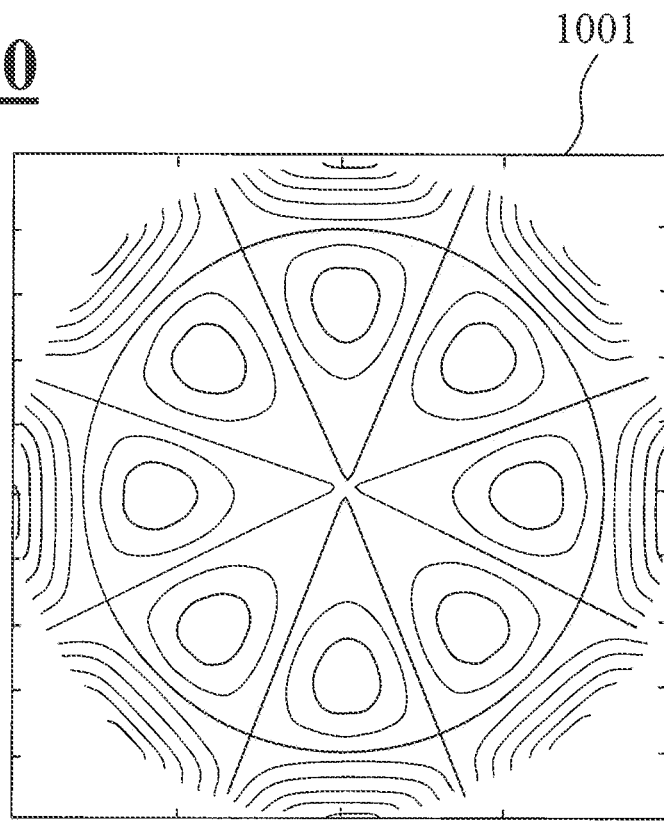
FIG. 10 shows the wavefront in a pupil of the projection system of FIG. 1 which is corrected with respect to the sine condition.

FIG. 9 shows a $Z_{28}$-deformed wavefront 901 which has been generated by a manipulation mean 222 like one of those described in U.S. Pat. No. 6,104,472, or WO2008034636A2, or WO2008037496A2, or US20060244940A1 (see, for example, above for a list of such mechanisms). Such mechanisms can be located at pupil 203. To generate this $Z_{28}$-deformation at the exit pupil a wavefront 1001 as in FIG. 10 has to be provided by the manipulation mean 222 at pupil 203.

In case of the manipulation mean 222 deforms a lens 210 as in WO2008037496A2 there are torques provided at the periphery of the lens 210. To provide a deformation of the wavefront 1001 the torques and forces at the periphery of the lens have to be modified with respect to the torques and forces to be provided to generate a deformation of the wavefront like 901.

In case of the manipulation mean 222 consists of a pair of Alvarez plates 223 as in U.S. Pat. No. 6,104,472 one has to calculate a primitive with respect to a coordinate of movement, say x. The primitive to be calculated is that of the wavefront deformation to be generated. Following the invention one has to calculate the primitive of the function given by FIG. 10 rather than by FIG. 9. More mathematically speaking one has to provide the Alvarez plates with the surface shape of $$\int_0^x Z_{28}(\Pi^{-1}(\rho), \varphi) dx$$

where $\rho=\sqrt{x^2+y^2}$ and $\phi=\arcsin x$. The integral can be calculated numerically.

The information disclosed herein can be used in dry projection systems as well as immersion projection systems.

What is claimed is:

1. A process of operating a lithographic system comprising a projection system having an object field and an image field, the projection system comprising an optical element located at a projection system pupil, the process comprising:
    projecting the object field through the projection system and onto the image field; and
    manipulating the projection system pupil via the optical element at normalized pupil heights $r=f(\rho)$ to manipulate an exit pupil of an object point at normalized pupil heights $\rho$,
    wherein $f: [0,1] \to [0,1]$ is a non-linear function approximating an offence against the sine condition $\phi_P$ with respect to the projection system pupil.

2. The process of claim 1, wherein the non-linear function $r=f(\rho)$ is a polynomial $f(\rho)=\Sigma_{i=1}^{m} b_i \rho^i$, and m is less than 5.

3. The process of claim 2, wherein m equals 2.

4. The process of claim 1, wherein the optical element comprises a diaphragm, and the process comprises stopping down the diaphragm proportional to $r=f(\rho)$ to stop down the exit pupil proportional to $\rho$.

5. The process of claim 1, comprising manipulating the projection system pupil via the optical element to manipulate a wavefront in the exit pupil $\Sigma_i \alpha_i Z_i(\rho,\phi)$, wherein manipulating the optical element significantly influences a finite subset of Zernike coefficients $\{\alpha_i; i=i_1, \ldots, i_k\}$.

6. The process of claim 1, wherein an image side aperture of the projection system is not less than 0.9 and the projection system is a dry projection system.

7. The process of claim 1, wherein an image side numerical aperture of the projection system is not less than 1.35, and the projection system is an immersion projection system.

8. The process of claim 1, wherein the image field is not less than 56 mm.

9. The process of claim 1, wherein the projection system is of a catadioptric projection system.

10. The process of claim 9, wherein the projection system is an immersion projection system.

11. The process of claim 1, wherein the projection system is an immersion projection system 12. The process of claim 1, wherein the projection system includes two biconvex lenses located at the projection system pupil.

13. The process of claim 1, wherein the projection system has an optical axis, and the projection is done via rays of light, wherein outermost rays of the light at the projection system pupil are parallel to the optical axis.

14. The process of claim 1, wherein the optical element comprises a lens.

15. The process of claim 1, wherein the optical element comprises a mirror.

16. The process of claim 1, wherein the manipulation is a deformation of the optical element.

17. The process of claim 1, wherein the manipulation is achieved by loading heat and/or cold into the optical element.

18. The process of claim 1, wherein the manipulation is achieved by shifting or rotating optical element.

* * * * *

UNITED STATES PATENT AND TRADEMARK OFFICE
CERTIFICATE OF CORRECTION

PATENT NO. : 9,001,310 B2
APPLICATION NO. : 13/626416
DATED : April 7, 2015
INVENTOR(S) : Dirk Juergens It is certified that error appears in the above-identified patent and that said Letters Patent is hereby corrected as shown below:

In the Specification

Col. 2, line 67, delete "i. e.," and insert -- i.e., --.

Col. 3, line 1, delete "i. e." and insert -- i.e., --.

Col. 3, line 2, delete "is the to" and insert -- is to --.

Col. 3, lines 29-30, delete "is the to" and insert -- is to --.

Col. 3, line 47, delete "i. e.," and insert -- i.e., --.

Col. 5, line 22, delete "$\sum_i a_i Z_i(\rho,\varphi)$ of" and insert -- $\sum_i a_i Z_i(\rho,\varphi)$ of --.

Col. 5, line 42, delete "$f_P::[0,1]$" and insert -- $f_P:[0,1]$ --.

Col. 6, line 7, delete "an a" and insert -- a --.

Col. 8, line 12, delete "3.5 mm" and insert -- 3.5 mm. --.

Col. 8, line 37, delete "i. e." and insert -- i.e., --.

Col. 8, line 45, delete "=0.3252 $\rho^5$-0.0135 $\rho^3$+0.6851$\rho$," and insert
-- = $0.3252\rho^5 - 0.0135\rho^3 + 0.6851\rho$, --.

Col. 8, line 53, delete "$Z_{49}(\pi,\varphi)$." and insert -- $Z_{49}(\rho,\varphi)$. --.

Col. 9, line 35, delete "order. I.e." and insert -- order, i.e., --.

Signed and Sealed this
Twenty-ninth Day of September, 2015

Michelle K. Lee
*Director of the United States Patent and Trademark Office*

CERTIFICATE OF CORRECTION (continued)
U.S. Pat. No. 9,001,310 B2

Col. 9, lines 41-42, delete "is the to" and insert -- is to --.

Col. 9, line 57, delete "is the to" and insert -- is to --.

Col. 10, line 14, delete "i. e." and insert -- i.e., --.

In the Claims

Col. 12, line 13, Claim 11, delete "system" and insert -- system. --.